United States Patent
Kondo

(10) Patent No.: US 10,548,220 B2
(45) Date of Patent: Jan. 28, 2020

(54) MULTILAYER PRINTED WIRING BOARD, AND CONNECTION STRUCTURE OF MULTILAYER PRINTED WIRING BOARD AND CONNECTOR

(71) Applicant: HOSIDEN CORPORATION, Yao (JP)

(72) Inventor: Hayato Kondo, Yao (JP)

(73) Assignee: HOSIDEN CORPORATION, Yao-shi (JP)

(*) Notice: Subject to any disclaimer, the term of this patent is extended or adjusted under 35 U.S.C. 154(b) by 0 days.

(21) Appl. No.: 15/180,380

(22) Filed: Jun. 13, 2016

(65) Prior Publication Data
US 2016/0374199 A1    Dec. 22, 2016

(30) Foreign Application Priority Data
Jun. 19, 2015    (JP) .................... 2015-123401

(51) Int. Cl.
H05K 1/11        (2006.01)
H05K 1/02        (2006.01)
H01R 24/44       (2011.01)

(52) U.S. Cl.
CPC ............ *H05K 1/116* (2013.01); *H05K 1/025* (2013.01); *H05K 1/0298* (2013.01); *H01R 24/44* (2013.01);
(Continued)

(58) Field of Classification Search
CPC ...... H05K 1/116; H05K 1/025; H05K 1/0251; H05K 1/0298; H05K 1/0225;
(Continued)

(56) References Cited

U.S. PATENT DOCUMENTS 6,164,977 A    12/2000 Lester
6,356,166 B1 *  3/2002 Goldsmith ............ H01P 1/185
                                                     333/161
(Continued)

FOREIGN PATENT DOCUMENTS

JP    H06-260773 A    9/1994
JP    2001-244633 A1  9/2001
(Continued)

OTHER PUBLICATIONS

Extended European Search Report dated Nov. 22, 2016 for the counterpart European patent application No. 16020228.9.
(Continued)

*Primary Examiner* — Steven T Sawyer
*Assistant Examiner* — Paresh H Paghadal
(74) *Attorney, Agent, or Firm* — Kratz, Quintos & Hanson, LLP

(57) ABSTRACT

A multilayer printed wiring board including insulating layers, ground layers thereon, and at least one via hole. The ground layers include a wiring layer and a first impedance adjustment layer. The wiring layer includes a solid conductor and a conductive line. The conductive line is disposed inside an opening and a passage of the solid conductor. The first impedance adjustment layer includes a solid conductor having an opening. The via hole is located inside the openings of the wiring layer and the first impedance adjustment layer and is connected to the conductive line. A first distance is smaller than a second distance, where the first distance is a distance from an outline of the opening of the wiring layer to the via hole, and the second distance is a distance from an outline of the opening of the first impedance adjustment layer to the via hole.

18 Claims, 9 Drawing Sheets

(52) U.S. Cl.
CPC .......... *H05K 1/0224* (2013.01); *H05K 1/0225* (2013.01); *H05K 1/0251* (2013.01); *H05K 1/111* (2013.01); *H05K 1/115* (2013.01); *H05K 2201/07* (2013.01); *H05K 2201/093* (2013.01); *H05K 2201/096* (2013.01); *H05K 2201/09336* (2013.01); *H05K 2201/09718* (2013.01)

(58) Field of Classification Search
CPC ..... H05K 2201/07; H05K 2201/09336; H05K 2201/09618; H05K 2201/09718; H01R 24/44; H01R 24/50
See application file for complete search history.

(56) References Cited

U.S. PATENT DOCUMENTS

| | | | |
|---|---|---|---|
| 2002/0034839 A1 | 3/2002 | Iwaki et al. | |
| 2002/0130737 A1 | 9/2002 | Hreish et al. | |
| 2003/0133279 A1* | 7/2003 | Shirasaki | H01P 1/047 361/795 |
| 2006/0097736 A1* | 5/2006 | Oldrey | G01R 31/31905 324/756.05 |
| 2006/0261825 A1 | 11/2006 | Jiang et al. | |
| 2008/0093112 A1* | 4/2008 | Kushta | H01P 1/2039 174/260 |
| 2009/0015345 A1* | 1/2009 | Kushta | H05K 1/0251 333/34 |
| 2009/0045889 A1* | 2/2009 | Goergen | H05K 1/0216 333/175 |
| 2009/0056999 A1 | 3/2009 | Kashiwakura | |
| 2011/0248800 A1* | 10/2011 | Kushta | H01P 1/2056 333/204 |
| 2012/0119853 A1* | 5/2012 | Kushta | H01P 7/04 333/204 |
| 2014/0077896 A1* | 3/2014 | Lee | H03H 7/17 333/185 |

FOREIGN PATENT DOCUMENTS

| | | |
|---|---|---|
| JP | 2009-59873 A1 | 3/2009 |
| JP | 2015-050679 A | 3/2015 |

OTHER PUBLICATIONS

Shuai Jin et al., "Optimization of the Transition from Connector to PCB Board", 2013 IEEE International Symposium on Electromagnetic Compatibility, Aug. 5-9, 2013, pp. 192-196.

Office Action of Japanese Patent Application No. 2015-123401: Notification of Reasons for Refusal dated Oct. 30, 2018 (3 pages, 3 pages translation, 6 pages total).

* cited by examiner

MULTILAYER PRINTED WIRING BOARD, AND CONNECTION STRUCTURE OF MULTILAYER PRINTED WIRING BOARD AND CONNECTOR

CROSS-REFERENCE TO RELATED APPLICATIONS

The present application claims priority under 35 U.S.C. § 119 of Japanese Patent Application No. 2015-123401 filed on Jun. 19, 2015, the disclosure of which is expressly incorporated by reference herein in its entity.

BACKGROUND OF THE INVENTION

Technical Field

The invention relates to multilayer printed wiring boards and connection structures of the multilayer printed wiring boards and connectors.

Background Art

Japanese Unexamined Patent Publication No. 2001-244633 and Japanese Unexamined Patent Publication No. 2009-59873 disclose conventional multilayer printed wiring boards. Each multilayer printed wiring board includes a plurality of layers and a through via hole (through hole) passing therethrough. The layers include a plurality of ground layers, a wiring layer, and a plurality of insulating layers. The ground layers and the wiring layer are provided on the respective insulating layers. The wiring layer has a conductive line connected to the through via hole. The ground layers each have a solid conductor located around the through via hole. The solid conductors are grounded.

SUMMARY OF INVENTION

The through via hole tends to be lower in impedance than the conductive line because the through via hole is surrounded by the solid conductors of the ground layers.

In view of the above circumstances, the invention provides a multilayer printed wiring board with a via hole of increased impedance. The invention also provides a connection structure of such a multilayer printed wiring board and a connector.

The multilayer printed wiring board according to one aspect of the present invention includes a plurality of insulating layers, a plurality of ground layers on the respective insulating layers, and at least one via hole in at least one of the insulating layers and at least one of the ground layers. The ground layers include a wiring layer and a first impedance adjustment layer. The wiring layer includes a solid conductor and a conductive line. The solid conductor has an opening and a passage, with the passage communicating with the opening. The conductive line is disposed inside the opening and the passage. The first impedance adjustment layer includes a solid conductor, and the solid conductor of the first impedance adjustment layer has an opening. The via hole is located inside the opening of the wiring layer and inside the opening of the first impedance adjustment layer and is connected to the conductive line. A first distance is smaller than a second distance, where the first distance is a distance in a first direction from an outline of the opening of the wiring layer to the via hole, and the second distance is a distance in the first direction from an outline of the opening of the first impedance adjustment layer to the via hole. The first direction is a plane direction of the multilayer printed wiring board.

In the multilayer printed wiring board of this aspect with the first distance smaller than the second distance, the distance from the solid conductor of the first impedance adjustment layer to the via hole is larger in the first direction than the distance in the first direction from the solid conductor of the wiring layer to the via hole. This distance relationship contributes to increased impedance of the via hole.

The via hole may include a first land and a second land. The first land may be provided inside the opening of the wiring layer. The second land may be provided inside the opening of the first impedance adjustment layer.

The second land may be smaller in outside dimension than the first land. In this case, the first distance may be a distance in the first direction from the outline of the opening of the wiring layer to the first land of the via hole. The second distance may be a distance in the first direction from the outline of the opening of the first impedance adjustment layer to the second land of the via hole. In the multilayer printed wiring board of this aspect, the distance relationship "the first distance<the second distance" is satisfied by making the first land different in outside dimension from the second land. This configuration also facilitates impedance adjustment of the via hole.

Alternatively, the second land may include at least one recess recessed toward a central axis of the via hole. In the multilayer printed wiring board of this aspect, the first distance may be a distance in the first direction from the outline of the opening of the wiring layer to the first land of the via hole, and the second distance may be a distance in the first direction from the outline of the opening of the first impedance adjustment layer to a bottom of the recess of the second land of the via hole. The distance relationship "the first distance<the second distance" is satisfied in the multilayer printed wiring board of this aspect by providing the recess in the second land. Moreover, the provision of the recess in the second land also facilitates impedance adjustment of the via hole.

The outline of the opening of the wiring layer may be located closer to the central axis of the via hole than the outline of the opening of the first impedance adjustment layer. This arrangement allows the multilayer printed wiring board to satisfy the distance relationship "the first distance<the second distance." Moreover, simply by thus adjusting the positional relationship between the outline of the opening of the wiring layer and the outline of the opening of the first impedance adjustment layer, the impedance of the via hole can be readily adjusted.

The ground layers may further include a second impedance adjustment layer. The second impedance adjustment layer may include a solid conductor and an impedance adjustment portion. The solid conductor may have an opening. The impedance adjustment portion may be a conductor at the solid conductor of the second impedance adjustment layer. The impedance adjustment portion may overlap the conductive line of the wiring layer. The via hole may be provided in at least one of the ground layers and at least one of the insulating layers such as to be located inside the respective openings of the wiring layer, the first impedance adjustment layer, and the second impedance adjustment layer. In the multilayer printed wiring board of this aspect, the conductive line has decreased impedance because it is overlapped with the impedance adjustment portion of the second impedance adjustment layer.

The first impedance adjustment layer may be disposed between the wiring layer and the second impedance adjustment layer. In general, the second impedance adjustment layer located too close to the wiring layer will excessively decrease the impedance of the conductive line of the wiring layer. On the contrary, in the multilayer printed wiring board of this aspect, it is possible to sufficiently but not excessively lower the impedance of the conductive line of the wiring layer. This in turn facilitates impedance matching of the conductive line with the via hole.

The ground layers may further include a connection layer. The connection layer may include a solid conductor having an opening. If the ground layers does not include the second impedance adjustment layer, the via hole may be provided in at least one of the ground layers and at least one of the insulating layers such as to be located in the respective openings of the wiring layer, the first impedance adjustment layer, and the connection layer. If the ground layers include the second impedance adjustment layer, the via hole may be provided in at least one of the ground layers and at least one of insulating layers such that the via hole is located inside the respective openings of the wiring layer, the first impedance adjustment layer, the second impedance adjustment layer, and the connection layer.

The wiring layer may be a first outermost layer of the multilayer printed wiring board. The connection layer may be a second outermost layer opposite the first outermost layer of the multilayer printed wiring board. If the ground layers does not include the second impedance adjustment layer, if the wiring layer is the first outermost layer, and if the connection layer is the second outermost layer, then the via hole may be provided in the ground layers and the insulating layers such as to be located inside the respective openings of the wiring layer, the first impedance adjustment layer, and the connection layer. If the ground layers include the second impedance adjustment layer, and the wiring layer is the first outermost layer, and the connection layer is the second outermost layer, then the via hole may be provided in the ground layers and the insulating layers such as to be located inside the respective openings of the wiring layer, the first impedance adjustment layer, the second impedance adjustment layer, and the connection layer.

The first impedance adjustment layer may be disposed between the wiring layer and the second impedance adjustment layer and/or between the second impedance adjustment layer and the connection layer.

The third distance may be smaller than the second distance, where the third distance may be the distance in the first direction from the outline of the opening of the connection layer to the via hole. In the multilayer printed wiring board of this aspect, satisfying the positional relationships "the first distance<the second distance" and "the third distance<the second distance", the distance from the solid conductor of the first impedance adjustment layer to the via hole is larger in the first direction than the distance from the solid conductor of the wiring layer to the via hole, and the distance from the solid conductor of the first impedance adjustment layer to the via hole is larger in the first direction than the distance from the solid conductor of the connection layer to the via hole. These distance relationships contribute to increased impedance of the via hole.

The opening of the wiring layer may be generally of circular loop shape. The opening of the first impedance adjustment layer may be generally of circular loop shape. The via hole may be generally of cylindrical shape. In this case, the first direction may correspond to a radial direction of the via hole.

The opening of the second impedance adjustment layer may include a first flat outline, which may be a straight line orthogonal to the conductive line, and a second outline of arc shape. Alternatively, the openings of the wiring layer and the second impedance adjustment layer may be of circular loop shape. In this case, the opening of the second impedance adjustment layer may be located with its center displaced from the center of the opening of the wiring layer, in the direction opposite to the direction in which the conductive line is led out. Still alternatively, the opening of the second impedance adjustment layer may be of trapezial/trapezoidal shape. In this case, the opening may have a first outline that corresponds to the shorter base of the trapezium/trapezoid and is orthogonal to the conductive line.

A connection structure of an aspect of the invention includes the multilayer printed wiring board of any aspect described above and a connector. The via hole of the multilayer printed wiring board is a through via hole or a blind via hole. The connector includes a terminal. The terminal includes a tail is received in and connected to the via hole. The connection structure of this aspect satisfies the distance relationship "the first distance<the second distance", making it possible to increase the impedances of the via hole and the tail of the terminal. When the terminal, the via hole, and the conductive line of the wiring layer are used as elements of a signal transmission path, impedance matching can be easily made between these elements.

Figure 1A:
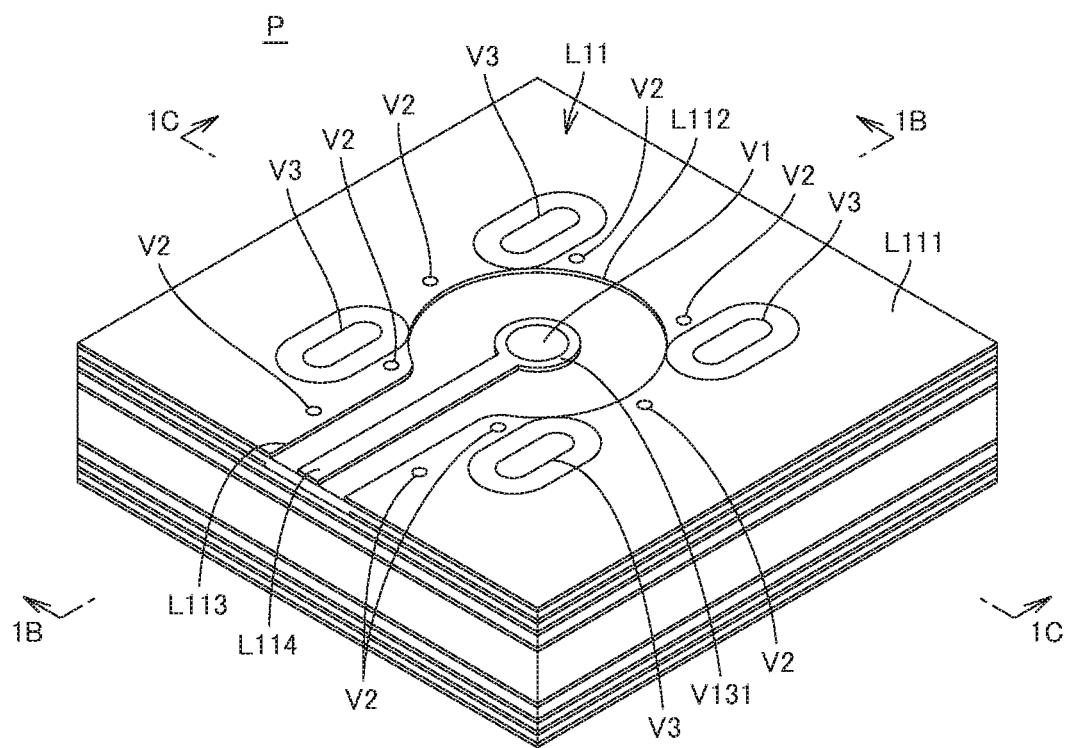
FIG. 1A is a perspective view of a multilayer printed wiring board according to an embodiment of the invention.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the multilayer printed wiring board, the connection structure, and their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

The following describes embodiments of a multilayer printed wiring board of the invention, collectively referred to as a multilayer printed wiring board P or simply as a wiring board P, with reference to FIG. 1A to FIG. 6. The wiring plate P includes a plurality of ground layers L1, a plurality of insulating layers L2, and at least one via hole V1 (via hole defined in the claims). These constituents of the wiring plate P will be described below in detail. The Y-Y' direction indicated in FIG. 1C is a planar direction of the wiring plate P, which corresponds to the first direction defined in the claims. The Z-Z' direction indicated in FIG. 1C is a thicknesses direction of the wiring plate P. The Z-Z' direction is orthogonal to the Y-Y' direction.

The ground layers L1 and the insulating layers L2 are disposed alternately in the Z-Z' direction. The via hole V1 may be a through via hole in the ground layers L1 and the insulating layers L2 such as to pass through all of the ground layers L1 and the insulating layers L2, or alternatively be a blind via hole in at least one of the ground layers L1 and at least one of the insulating layers L2 such as to pass through the at least one of the ground layers L1 and the at least one of the insulating layers L2. The blind via hole may open to either face (top face or bottom face as shown) of the wiring plate P. In the embodiments of FIG. 1A to FIG. 7, the via hole V1 is a through via hole.

Figure 1B:
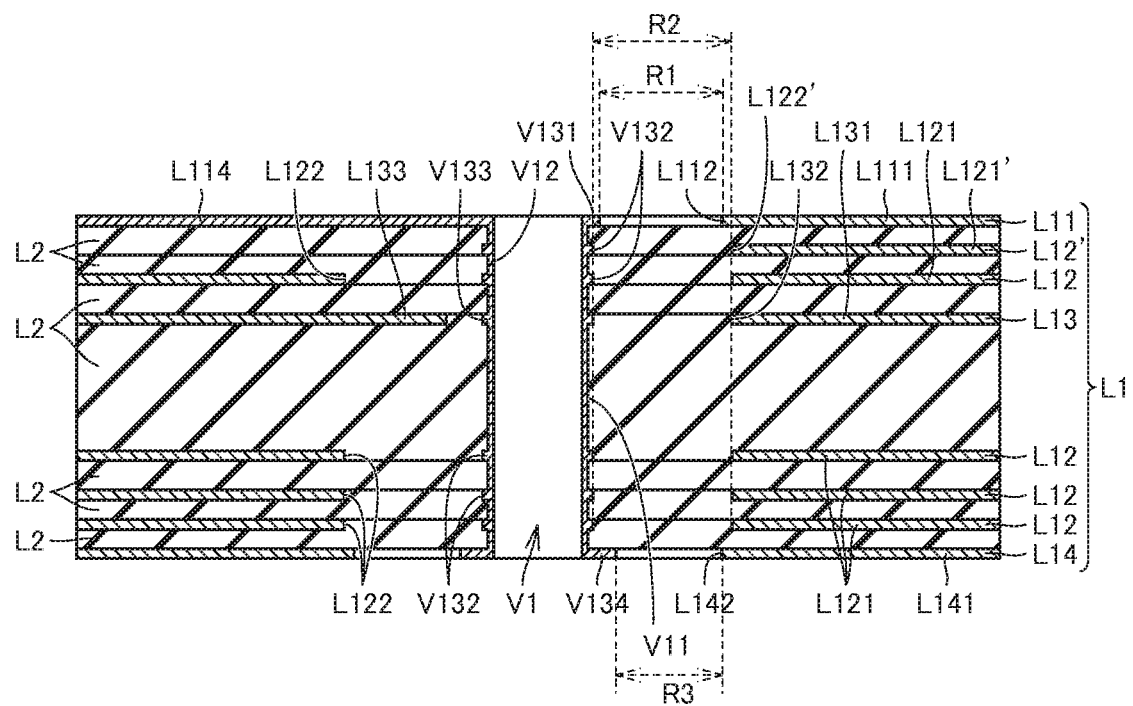
FIG. 1B is a sectional view of the multilayer printed wiring board, taken along 1B-1B in FIG. 1A.
Figure 1C:
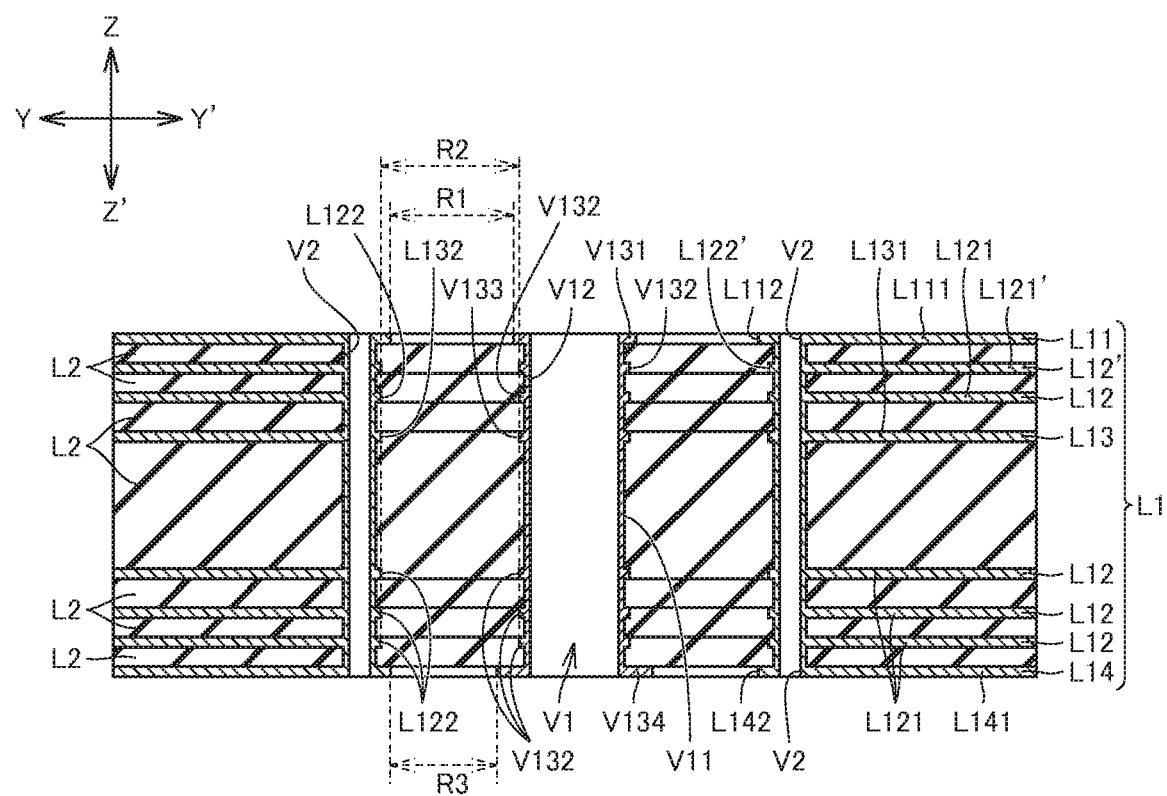
FIG. 1C is a sectional view of the multilayer printed wiring board, taken along 1C-1C in FIG. 1A.

The ground layers L1 include at least one wiring layer L11, and at least one first impedance adjustment layer L12. The wiring layer L11 can be any one of the ground layers L1. The wiring layer L11 may be an outermost layer of the wiring plate P (the first outermost layer as defined in the claims, top layer as shown in FIG. 1A to 1C).

Figure 2:
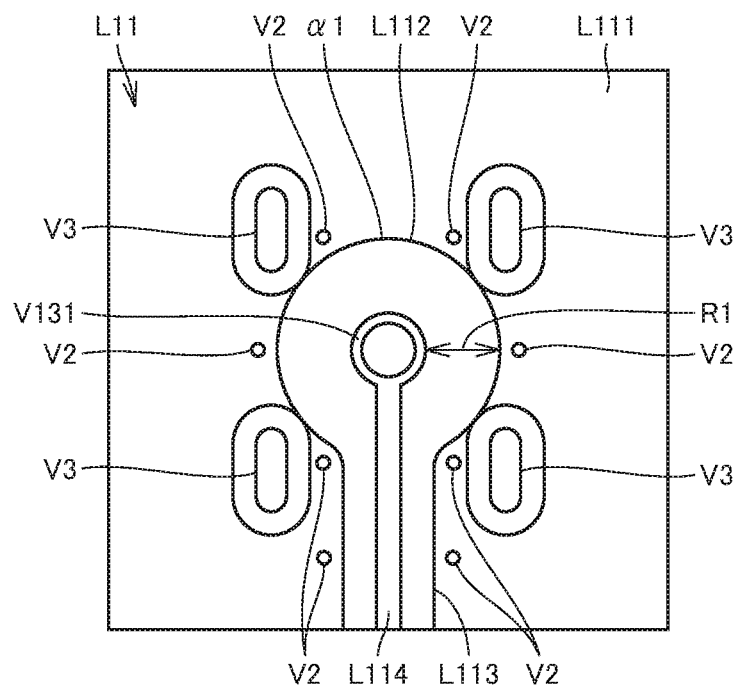
FIG. 2 illustrates a wiring layer of the multilayer printed wiring board.

As best illustrated in FIG. 2, the wiring layer L11 includes a solid conductor L111, an opening L112, a passage L113, and a conductive line L114. The solid conductor L111 is provided on and in contact with the insulating layer L2, which is located immediately below the wiring layer L11. The solid conductor L111 is connected to the ground and formed with the opening L112 and the passage L113. When used herein, the term "solid conductor" means a thin sheet of electrically conductive material. Each solid conductor of the multilayer printed wiring board P serves as a ground plane.

The opening L112 and the passage L113 are areas of the wiring layer L11 in which the solid conductor L111 does not exist. The opening L112 is of a circular loop shape and concentric with the via hole V1. The opening L112 has an arc-shaped outline α1. The outline α1 forms the border between the opening L112 and the solid conductor L111. The passage L113 communicates with and extends away from the opening L112. The passage L113 may extend in a straight line or with one or more bends, or may be curved entirely or partially.

The conductive line L114 is provided on and in contact with the insulating layer L2, which is located immediately below the wiring layer L11, such as to be located inside the opening L112 and the passage L113. The conductive line L114 extends away from, i.e. connected to the via hole V1.

Figure 3:
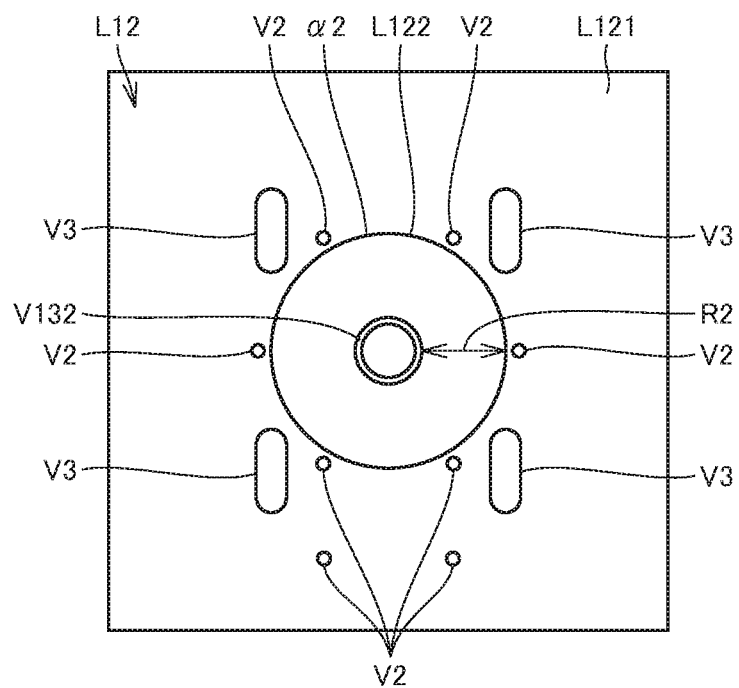
FIG. 3 illustrates a first impedance adjustment layer of the multilayer printed wiring board.

The at least one first impedance adjustment layer L12 may be any one of the ground layers L1 excluding the wiring layer L11. As best illustrated in FIG. 3, the first impedance adjustment layer L12 has a solid conductor L121 and an opening L122. The solid conductor L121 is provided on and in contact with the insulating layer L2, which is located immediately below the first impedance adjustment layer L12. The solid conductor L121 is connected to the ground and formed with the opening L122.

The opening L122 is an area of the first impedance adjustment layer L12 in which the solid conductor L121 does not exist. The opening L122 is of a circular loop shape and concentric with the via hole V1. The opening L122 has a ring-shaped outline α2. The outline α2 forms the border between the opening L122 and the solid conductor L121.

As best illustrated in FIG. 1B and FIG. 1C, the via hole V1 is located inside the opening L112 of the wiring layer L11 and the opening L122 of the first impedance adjustment layer L12. The via hole V1 has a hole V11, a connection conductor V12, at least one first land V131, and at least one second land V132. The via hole V1 has an outer diameter (including the outer diameters of the first land V131 and the second land V132) that is smaller than the outer diameter of the opening L112 and than the outer diameter of the opening L122. If the via hole V1 is a through via hole, the hole V11 should be a cylindrical through hole passing through all of the ground layers L1 and the insulating layers L2. If the via hole V1 is a blind via hole, the hole V11 should be a cylindrical blind hole passing through at least one of the ground layers L1 and through at least one of the insulating layers L2, and the hole V11 may open to either face of the wiring plate P (the top or bottom face as shown). The connection conductor V12 is a circular tuboid conductor provided along the circumference of the hole V11.

The first land V131 is a circular loop shaped conductor on and in contact with the insulating layer L2, which is located immediately below the wiring layer L11, such that the first land V131 is located inside the opening L112 of the wiring layer L11 (see FIG. 2). The first land V131 is smaller in outer diameter than the opening L112 of the wiring layer L11. The first land V131 is concentric with the hole V11 and the opening L112 of the wiring layer L11. The first land V131 is connected to the connection conductor V12 and also to the conductive line L114 of the wiring layer L11.

The second land V132 is a circular loop shaped conductor on and in contact with the insulating layer L2, which is located immediately below the first impedance adjustment layer L12, such that the second land V132 is located inside the opening L122 of the first impedance adjustment layer L12 (See FIG. 3). The second land V132 is smaller in outer diameter than the opening L122 of the first impedance adjustment layer L12. The second land V132 is concentric with the hole V11, the opening L122 of the first impedance adjustment layer L12, and the first land V131. The second land V132 is connected to the connection conductor V12.

It should be noted that a distance relationship "the first distance R1<the distance R2" is established. Here the first distance R1 is the distance in the Y-Y' direction (a radial direction of the via hole V1) from the outline α1 of the opening L112 of the wiring layer L11 to the first land V131 of the via hole V1 as illustrated in FIG. 1C and FIG. 2, and the second distance R2 is a distance in the Y-Y' direction from the outline α2 of the opening L122 of the first impedance adjustment layer L12 to the second land V132 of the via hole V1 as illustrated in FIG. 1C and FIG. 3.

The distance relationship R1<R2 can be satisfied in any the following arrangements (1) to (5). Arrangement (2) is adopted in the embodiments of FIG. 1A to FIG. 3. (1) The second land V132 is smaller in outer diameter than the first land V131, and the outline α1 of the opening L112 overlaps the outline α2 of the opening L122 in the Z-Z' direction, i.e.

the opening L112 has the same outer diameter as that of the opening L122. (2) The second land V132 is smaller in outer diameter (in outside dimension) than the first land V131, and the outline α1 of the opening L112 is located inside of the outline α2 of the opening L122 in the radial direction described above (closer to the central axis of the via hole V1 than the outline α2), i.e. the opening L112 is smaller in outer diameter than the opening L122. (3) The second land V132 is smaller in outer diameter (in outside dimension) than the first land V131, and the outline α1 of the opening L112 is located outside of the outline α2 of the opening L122 in the radial direction described above (farther apart from the central axis of the via hole V1 than the outline α2), i.e. the opening L112 is larger in outer diameter than the opening L122. (4) The second land V132 has the same outer diameter (outside dimension) as that of the first land V131, and the outline α1 of the opening L112 is located inside of the outline α2 of the opening L122 in the radial direction described above (closer to the central axis of the via hole V1), i.e. the opening L112 is smaller in outer diameter than the opening L122. (5) The second land V132 is larger in outer diameter (in outside dimension) than the first land V131, and the outline α1 of the opening L112 is located inside of the outline α2 of the opening L122 in the radial direction described above (closer to the central axis of the via hole V1), i.e. the opening L112 is smaller in outer diameter than the opening L122.

The ground layers L1 may include a plurality of first impedance adjustment layers L12. In this embodiment, the via hole V1 is located inside the opening L112 of the wiring layer L11 and the respective openings L122 of the first impedance adjustment layers L12; the via hole V1 a through via hole or blind via hole as described above; the via hole V1 includes a plurality of second lands V132; the second lands V132 are circular loop shaped conductors on the insulating layers L2 located immediately below the first impedance adjustment layers L12 such that the second lands are located inside the respective openings L122 of the first impedance adjustment layers L12.

Figure 4:
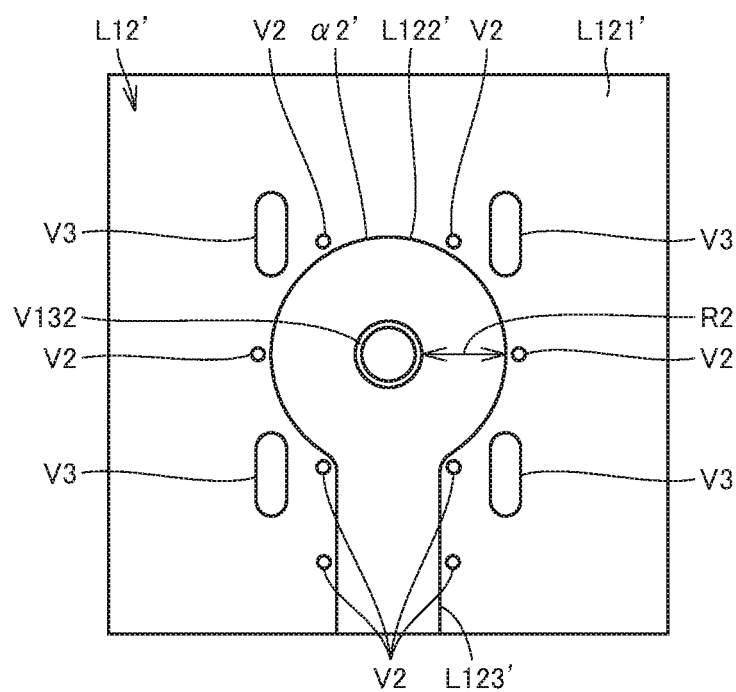
FIG. 4 illustrates a variant of the first impedance adjustment layer of the multilayer printed wiring board.

The first impedance adjustment layers L12 may include a first impedance adjustment layer L12'. The first impedance adjustment layer L12' may be located immediately below the insulating layers L2 located immediately below the wiring layer L11. As best illustrated in FIG. 4, the first impedance adjustment layer L12' includes a solid conductor L121', an opening L122', and a passage L123'. The solid conductor L121' is provided on and in contact with the insulating layers L2, which is located immediately below the first impedance adjustment layer L12'. The solid conductor L121' is connected to the ground and formed with the opening L122' and the passage L123'.

The opening L122' and the passage L123' are areas of the first impedance adjustment layer L12' in which the solid conductor L121' does not exist. The opening L122' is of a circular loop shape and concentric with the via hole V1. The opening L122' has a circular outline α2'. The outline α2' forms the border between the opening L122' and the solid conductor L121'. The passage L123' communicates with the opening L122' and extends from the opening L122' in the direction in which the conductive line L114 is led out.

The ground layers L1 may further include a second impedance adjustment layer L13. In this case, it is preferable, but not limited, that the at least one first impedance adjustment layer L12 be disposed between the wiring layer L11 and the second impedance adjustment layer L13.

The second impedance adjustment layer L13, if provided, includes a solid conductor L131, an opening L132, and an impedance adjustment portion L133. The solid conductor L131 is provided on and in contact with the insulating layers L2, which is immediately below the second impedance adjustment layer L13. The solid conductor L131 is connected to the ground and formed with the opening L132.

The opening L132 is an area of the second impedance adjustment layer L13 in which the solid conductor L131 does not exist. The opening L132 may be configured as shown in FIG. 5A, 5B, or FIG. 5C.

Figure 5A:
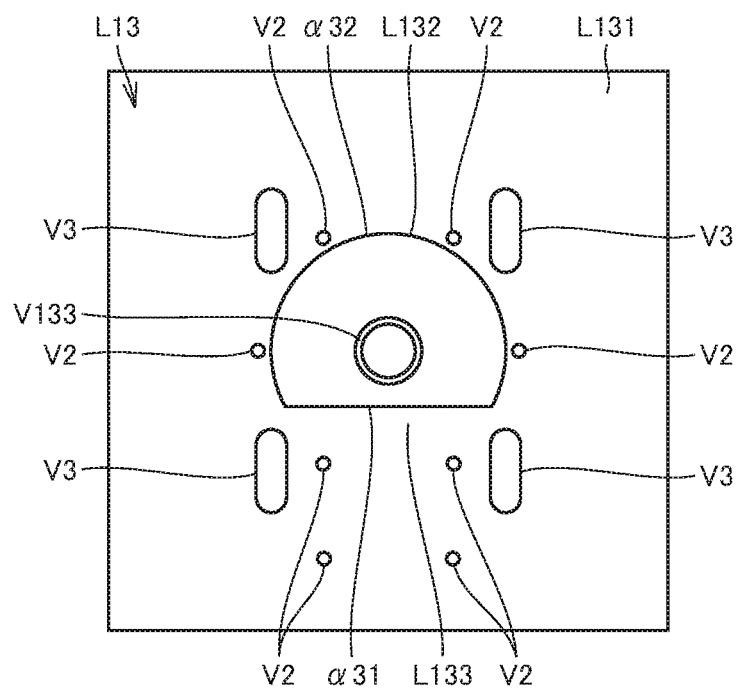
FIG. 5A illustrates a second impedance adjustment layer of the multilayer printed wiring board.

The opening L132 illustrated in FIG. 5A includes a first outline α31 and a second outline α32. The first outline α31 is a straight line that extends in the Y-Y' direction and is orthogonal to the conductive line L114 of the wiring layer L11. The first outline α31 has a first end and a second end opposite to the first end. The second outline α32 is an arc-shaped line connecting between the first and second ends of the first outline α31. The first outline α31 and the second outline α32 forms the border between the opening L132 and the solid conductor L131.

Figure 5B:
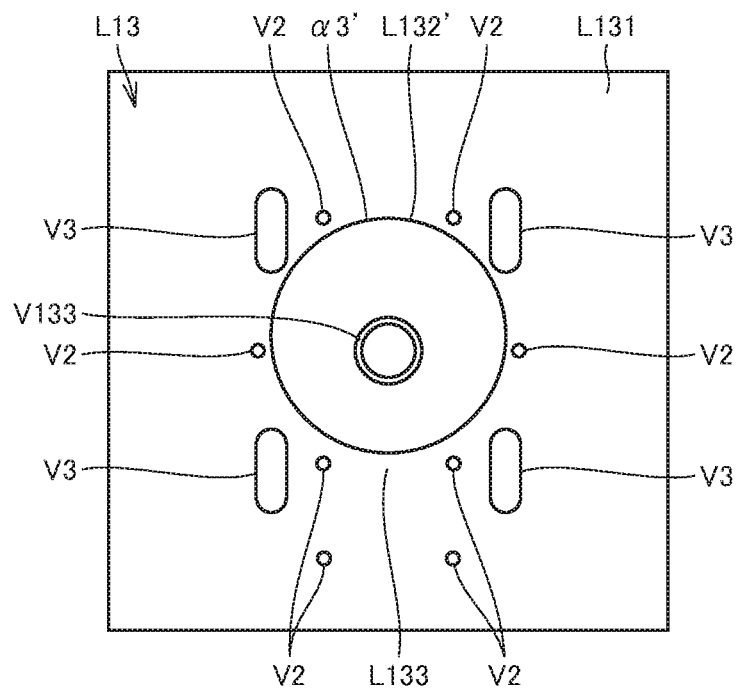
FIG. 5B illustrates a modified second impedance adjustment layer of the multilayer printed wiring board.

The opening L132' illustrated in FIG. 5B is of a circular loop shape and located outside the via hole V1. More particularly, the opening L132' is located with its center displaced from the center of the opening L112 of the wiring layer L11, in the direction opposite to the direction in which the conductive line L114 is led out. The opening L132' has an outline α3'. The outline α3' forms the border between the opening L132' and the solid conductor L131.

Figure 5C:
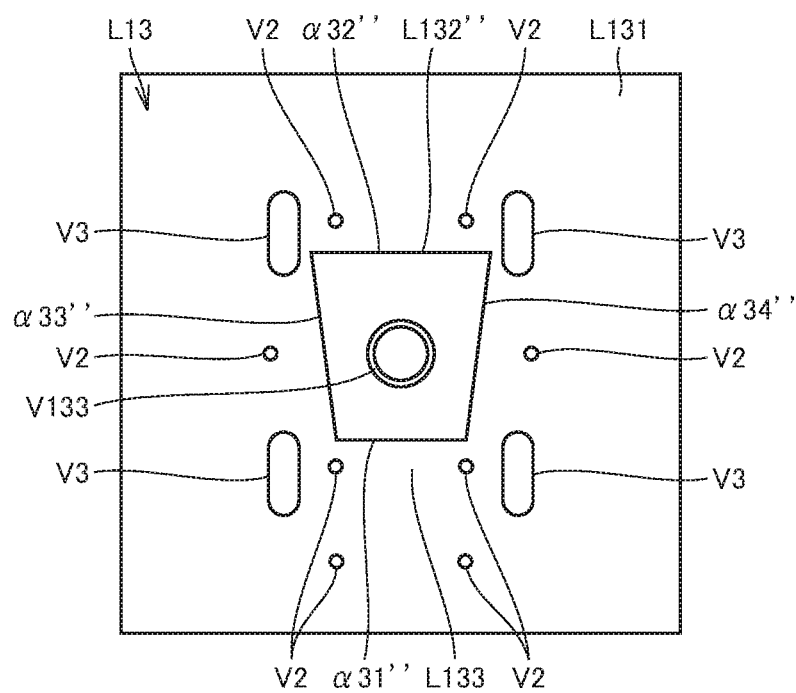
FIG. 5C illustrates another modified second impedance adjustment layer of the multilayer printed wiring board.

An opening L132" illustrated in FIG. 5C is of trapezial/trapezoidal shape. The opening L132" has a first outline α31", a second outline α32", a third outline α33", and a fourth outline α34". The first outline α31", the shorter base of the trapezium/trapezoid, extends in the Y-Y' direction orthogonally to the conductive line L114 of the wiring layer L11. The second outline α32" is the longer base of the trapezium/trapezoid. The third outline α33" and the fourth outline α34" are the legs of the trapezium/trapezoid. These four outlines form the border between the opening L132" and the solid conductor L131.

The impedance adjustment portion L133 is a conductor in the solid conductor L131. The impedance adjustment portion L133 is disposed such as to overlap the conductive line L114 of the wiring layer L11 in the Z-Z' direction, so that the impedance of the conductive line L114 is reduced. In an embodiment where the second impedance adjustment layer L13 includes the opening L132 as shown in FIG. 5A, the impedance adjustment portion L133 is a portion of the solid conductor L131 located outside relative to the first outline α31 of the opening L132 in the direction in which the conductive line L114 is led out. In an embodiment where the second impedance adjustment layer L13 includes the opening L132' as shown in FIG. 5B, the impedance adjustment portion L133 is a portion of the solid conductor L131 located outside relative to the outline α3' of the opening L132' in the direction in which the conductive line L114 is led out. In an embodiment where the second impedance adjustment layer L13 includes the opening L132" as shown in FIG. 5C, the impedance adjustment portion L133 is a portion of the solid conductor L131 located outside relative to the outline α31" of the opening L132" in the direction in which the conductive line L114 is led out.

In an embodiment where the ground layers L1 further includes the second impedance adjustment layer L13, the via hole V1 is located inside the opening L112 of the or each wiring layer L11, the opening L122 of the or each first impedance adjustment layer L12, and the opening (L132, L132', or L132") of the second impedance adjustment layer L13. This via hole V1 is a through via hole or blind via hole configured as described above. The via hole V1 further includes a third land V133. The third land V133 is a circular loop shaped conductor on the insulating layers L2, which is located immediately below the second impedance adjustment layer L13. The third land V133 is located inside the opening of the second impedance adjustment layer L13 and concentric with the second land V132. The third land V133 has an outer diameter that is smaller than the outer size of the opening of the second impedance adjustment layer L13. The third land V133 may have the same outer diameter as that of the second land V132. The third land V133 is connected to the connection conductor V12 of the via hole V1.

The ground layers L1 may further include a connection layer L14. The connection layer L14 may be any one of the ground layers L1 excluding the wiring layer L11 and the first impedance adjustment layer L12. The connection layer L14 may alternatively be any one of the ground layers L1 excluding the wiring layer L11, the first impedance adjustment layer L12, and the second impedance adjustment layer L13. The connection layer L14 may be the second outermost layer of the wiring plate P, i.e. the outermost layer opposed to the first outermost layer of the wiring plate P (the bottom layer in the embodiment as shown in FIGS. 1A to 1C). In this case, the at least one first impedance adjustment layer L12 may be disposed between the wiring layer L11 and the connection layer L14. In an embodiment where the ground layers L1 include the second impedance adjustment layer L13, the at least one first impedance adjustment layer L12 may be disposed between the wiring layer L11 and the second impedance adjustment layer L13 and/or between the connection layer L14 and the second impedance adjustment layer L13. In the embodiments of FIG. 1A to FIG. 7, there is a plurality of first impedance adjustment layers L12 (including the first impedance adjustment layer L12') disposed between the wiring layer L11 and the second impedance adjustment layer L13, and there is another plurality of first impedance adjustment layers L12 disposed between the connection layer L14 and the second impedance adjustment layer L13.

Figure 6:
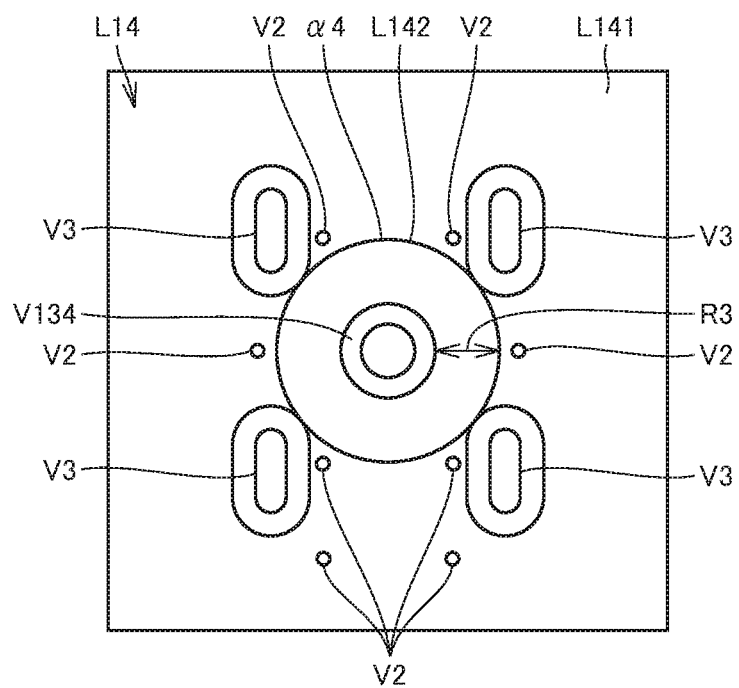
FIG. 6 illustrates a connection layer of the wiring layer of the multilayer printed wiring board.

As illustrated in FIG. 6, the connection layer L14 includes a solid conductor L141 and an opening L142. The solid conductor L141 is provided on and in contact with the insulating layer L2, which is located immediately above the connection layer L14. The solid conductor L141 is grounded and formed with the opening L142.

The opening L142 is an area of the connection layer L14 in which the solid conductor L141 does not exist. The opening L142 is of a circular loop shape and concentric with the via hole V1. The opening L142 has a circular outline α4. The outline α4 forms the border between the opening L142 and the solid conductor L141.

In an embodiment where the ground layers L1 further includes the connection layer L14, the via hole V1 is located inside the opening L112 of the wiring layer L11, the opening L122 of the first impedance adjustment layer L12, and the opening L142 of the connection layer L14. In an embodiment where the ground layers L1 further includes the connection layer L14 and the second impedance adjustment layer L13, the via hole V1 is located inside the opening L112 of the wiring layer L11, the opening L122 of the first impedance adjustment layer L12, the opening L132 of the second impedance adjustment layer L13, and the opening L142 of the connection layer L14. In either case, the via hole V1 is a through via hole or blind via hole configured as described above and further includes a fourth land V134. The fourth land V134 a circular loop shaped conductor provided on the insulating layers L2, which is located immediately above the connection layer L14. The fourth land V134 is located inside the opening L142 of the connection layer L14. The fourth land V134 is concentric with the opening L142, the hole V11, the first land V131, and the second land V132. The fourth land V134 is smaller in outer diameter than the opening L142 of the connection layer L14. The fourth land V134 is connected to the connection conductor V12 of the via hole V1.

It should be noted that a distance relationship "the third distance R3<the second distance R2" may be established. Here the third distance R3 is the distance in the Y-Y' direction (the radial direction described above) from the outline α4 of the opening L142 of the connection layer L14 to the fourth land V134 of the via hole V1 as illustrated in FIG. 1C and FIG. 6. The distance relationship R3<R2 can be satisfied in any the following arrangements (6) to (10). Arrangement (7) is adopted in the embodiments of FIG. 1A to FIG. 6. (6) The second land V132 is smaller in outer diameter (in outside dimension) than the fourth land V134, and the outline α4 of the opening L142 overlaps the outline α2 of the opening L122 in the Z-Z' direction, i.e. the opening L142 has the same outer diameter as that of the opening L122. (7) The second land V132 is smaller in outer diameter (in outside dimension) than the fourth land V134, and the outline α4 of the opening L142 is located inside of the outline α2 of the opening L122 (closer to the central axis of the via hole V1 than the outline α2), i.e. the opening L142 is smaller in outer diameter than the opening L122. (8) The second land V132 is smaller in outer diameter (in outside dimension) than the fourth land V134, and the outline α4 of the opening L142 is located outside of the outline α2 of the opening L122 in the radial direction (father apart from the central axis of the via hole V1 than the outline α2), i.e. the opening L142 is larger in outer diameter than the opening L122. (9) The second land V132 has the same outer diameter (the same outside dimension) as that the fourth land V134, and the outline α4 of the opening L142 is located inside of the outline α2 of the opening L122 in the radial direction (closer to the central axis of the via hole V1 than the outline α2), i.e. the opening L142 is smaller in outer diameter than the opening L122. (10) The second land V132 is larger in outer diameter (in outside dimension) than the fourth land V134, and the outline α4 of the opening L142 is located inside of the outline α2 of the opening L122 in the radial direction (closer to the central axis of the via hole V1 than the outline α2), i.e. the opening L142 is smaller in outer diameter than the opening L122.

Also, a distance relationship "the third distance R3<the first distance R1" may be established. This relationship can satisfied in any of the following arrangements (11) to (15). Arrangement (12) is adopted in the embodiments of FIG. 1A to FIG. 6. (11) The first land V131 is smaller in outer diameter (in outside dimension) than the fourth land V134, and the outline α4 of the opening L142 overlaps the outline α1 of the opening L112 of the wiring layer L11 in the Z-Z' direction, i.e. the opening L142 has the same outer diameter as that of the opening L112. (12) The first land V131 is smaller in outer diameter (in outside dimension) than the fourth land V134, and the outline α4 of the opening L142 is located inside of the outline α1 of the opening L112 in the radial direction (closer to the central axis of the via hole V1 than the outline α1), i.e. the opening L142 is smaller in outer diameter than the opening L112. (13) The first land V131 is smaller in outer diameter (in outside dimension) than the fourth land V134, and the outline α4 of the opening L142 is located outside of the outline α1 of the opening L112 in the radial direction (father apart from the central axis of the via hole V1 than the outline α1), i.e. the opening L142 is larger in outer diameter than the opening L112. (14) The first land V131 has the same outer diameter (the same outside dimension) as that of the fourth land V134, and the outline α4 of the opening L142 is located inside of the outline α1 of the opening L112 in the radial direction (closer to the central axis of the via hole V1 than the outline α1), i.e. the opening L142 is smaller in outer diameter than the opening L112. (15) The first land V131 is larger in outer diameter (in outside dimension) than the fourth land V134, and the outline α4 of the opening L142 is located inside of the outline α1 of the opening L11 in the radial direction (closer to the central axis of the via hole V1 than the outline α1), i.e. the opening L142 is smaller in outer diameter than the opening L112.

The wiring plate P may further include at least two via holes V2. The two via holes V2 or two of the via holes V2 may be symmetrically arranged outside the opening L112 of the wiring layer L11 and/or outside the passage L113. In the embodiments of FIG. 1A to FIG. 6, there are eight via holes V2 symmetrically arranged outside the opening L112 and outside the passage L113. The via holes V2 establish connection between the solid conductors of the ground layers L1. The via holes V2 may be through via holes in the ground layers L1 and the insulating layers L2 such as to pass through all of the ground layers L1 and the insulating layers L2, or may be blind via holes in at least one of the ground layers L1 and at least one of the insulating layers L2 such as to pass through the at least one of the ground layers L1 and the at least one of the insulating layers L2. The blind via hole may preferably open to either face (top face or bottom face as shown) of the wiring plate P. In the embodiments of FIG. 1A to FIG. 6, the via holes V2 are through via holes.

The wiring plate P may further include at least two via holes V3. The via holes V3 may be symmetrically arranged outside the opening L112 of the wiring layer L11. In the embodiments of FIG. 1A to FIG. 6, there are two via holes V3 symmetrically arranged outside the opening L112, and there are two more via holes V3 symmetrically arranged outside the opening L112. The via holes V3 are connected to the solid conductors of the ground layers L1. The via holes V3 may be through via holes in the ground layers L1 and the insulating layers L2 such as to pass through all of the ground layers L1 and the insulating layers L2, or may be blind via holes in at least one of the ground layers L1 and at least one of the insulating layers L2 such as to pass through the at least one of the ground layers L1 and the at least one of the insulating layers L2. The blind via hole may preferably open to either face (top face or bottom face as shown) of the wiring plate P. In the embodiments of FIG. 1A to FIG. 6, the via hole V3 is a through via hole.

Figure 7:
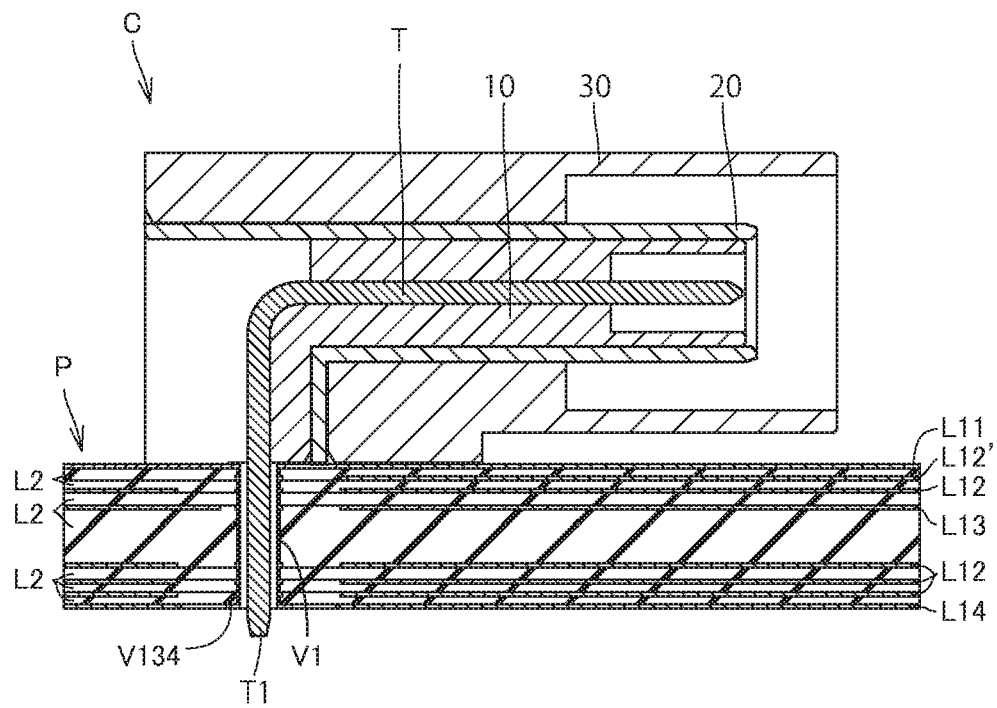
FIG. 7 is a sectional view of a connection structure of the multilayer printed wiring board and a connector according to the same embodiment of the invention, taken along 1B-1B in FIG. 1A.

The wiring plate P of any aspect described above can be connected to a connector C to form a connection structure for as illustrated in FIG. 7. The connector C is a coaxial connector mounted on the wiring plate P of any aspect described above. The connector C includes a terminal T, a body 10, a shell 20, and a case 30. These constituents of the connector C will be described below.

The body 10 is an insulating body to hold the terminal T. The shell 20 is a metallic housing to accommodate the body 10 and the terminal T. The shell 20 has at least two legs (not shown). The legs of the shell 20 are inserted into and connected to the associated via holes V3 of the wiring plate P. The case 30 is a housing of insulating resin, which serves to accommodate the shell 20, the body 10, and the terminal T. The terminal T is a generally L-shaped metallic plate. The terminal T includes a tail T1. The tail T1 extends through the via hole V1 of the wiring plate P and protrudes in the Z' direction out of the body 10 at a distal portion. The distal portion of the tail T1 is connected to the fourth land V134 of the via hole V1 by soldering or other means. The terminal T, the via hole V1, and the conductive line L114 form a signal transmission path capable of transmitting high-frequency signals.

The wiring plate P and the connection structure described above have at least the following technical features. First, increased impedance can be obtained in the via hole V1 of the wiring plate P for the following reason. The distance relationship R1<R2, or the distance relationships R1<R2 and R3<R2 are satisfied, making it possible to leave space from the solid conductors L121 of the first impedance adjustment layers L12 to the via hole V1. This arrangement results in increased impedance of the via hole V1. As a result, increased impedance is achieved both in the via hole V1 and in the tail T1 of the terminal T connected thereto.

Second, it is easy to regulate the impedance of the via hole V1 of the wiring plate P, and accordingly easy to regulate the impedances of the via hole V1 and the tail T1 of the terminal in the signal transmission path of the connection structure. Particularly, the impedance of the via hole V1 can be regulated simply by making the outside dimension of the first land V131 different from the outside dimension of the second land V132, and/or making the outside dimension of the opening L112 different from the outside dimension of the opening L122. Alternatively, the impedance of the via hole V1 can be regulated simply by making the outside dimension of the first land V131 different from the outside dimension of the second land V132, making the outside dimension of the opening L112 different from the outside dimension of the opening L122, making the outside dimension of the fourth land V134 different from the outside dimension of the second land V132, and/or making the outside dimension of the opening L142 different from the outside dimension of the opening L122.

Third, decreased impedance can be obtained in the conductive line L114 of the wiring layer L11 of the wiring plate P. This is because of the arrangement that the impedance adjustment portion L133 of the second impedance adjustment layer L13 of the wiring plate P is disposed such as to overlap the conductive line L114 of the wiring layer L11 in the Z-Z' direction. That is, the via hole V1 and the tail T1 of the terminal T provides increased impedances while the conductive line L114 provides decreased impedance, facilitating impedance matching in the signal transmission path of the connection structure.

To support the above technical features, simulations are conducted on a conductive line and a via hole in a signal transmission path for each of the connection structures that will be hereinafter referred to as first and second comparison examples. The connection structure of the first comparison example includes the a connector equivalent to the connector illustrated in FIG. 7, and a wiring board. The wiring board of the first comparison example includes a plurality of ground layers, a plurality of insulating layers, and a via hole. The ground layers and the insulating layers are alternately arranged. The ground layers include a wiring layer that is a first outermost layer of the wiring board and has the same configuration as the wiring layer L11, a connection layer that is a second outermost layer of the wiring board and has the same configuration as the connection layer L14, and a plurality of remaining ground layers that are inner layers of the wiring board. The remaining ground layers each include a solid conductor and an opening. Each solid conductor is provided on the insulating layer located immediately below each of the remaining ground layers, and is connected to the ground. Each opening is of a circular loop shape, concentric with the via hole, and provided in the solid conductor. The opening has the same outer diameter as that of the opening of the wiring layer. The via hole has the same configuration as the that of the via hole V1 of FIG. 1A to FIG. 1C, except that the first land is provided inside each of the openings of the remaining ground layers. The first lands are at the same distance in the Y-Y' direction (in a radial direction of the via hole) from the outlines of the openings of the wiring layer and the remaining ground layers. The connection structure of the second comparison example includes a connector equivalent to the connector illustrated in FIG. 7, and the wiring plate P illustrated in FIG. 1A to FIG. 1C. This wiring plate P includes the second impedance adjustment layer L13 as illustrated in FIG. 5A.

Figure 8:
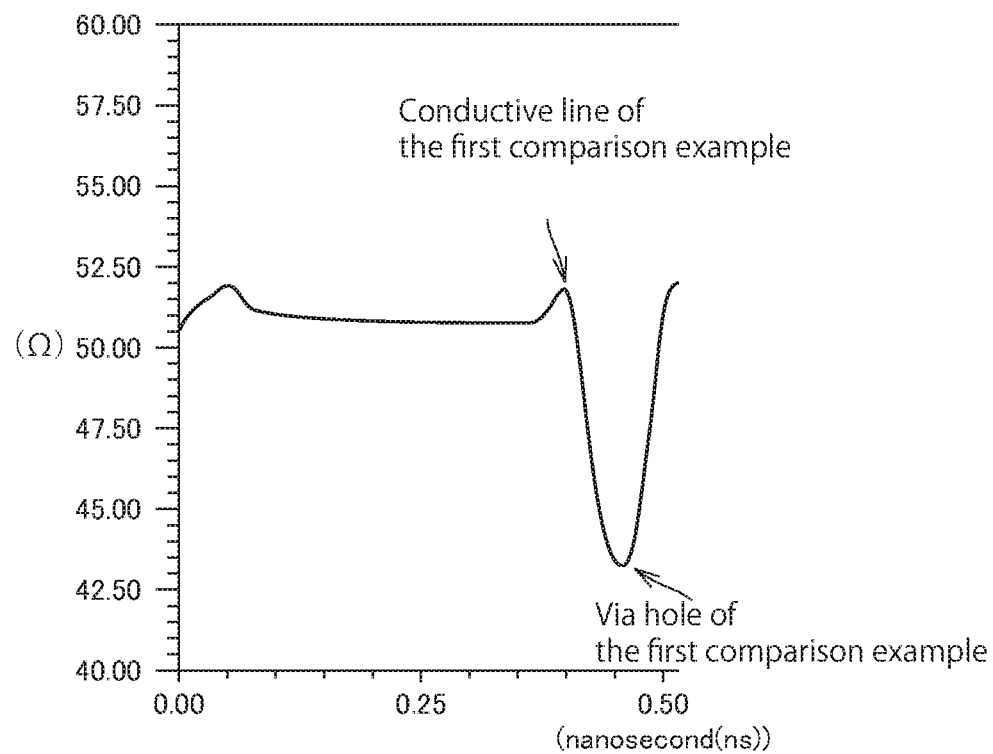
FIG. 8 is a graph of impedances obtained from simulating a conductive line and a via hole of a connection structure of a first comparison example.
Figure 9:
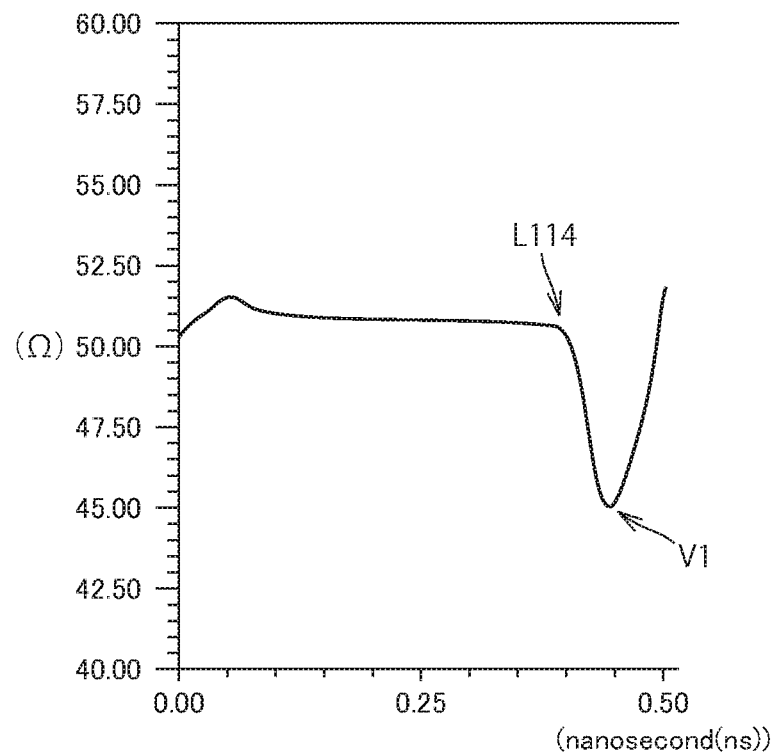
FIG. 9 is a graph of impedances obtained from simulating a conductive line and a via hole of a connection structure of a second comparison example.

Simulation results show that in the connection structure of the first comparison example, the conductive line of the wiring layer and the via hole exhibited impedances as shown in FIG. 8. On the other hand, in the connection structure of the second comparison example, the conductive line L114 of the wiring layer L11 and the via hole V1 exhibited impedances as shown in FIG. 9. Specifically, the conductive line L114 decreased in impedance by about 2Ω, compared to the conductive line of the connection structure of the first comparison example. The via hole V1 increased in impedance by about 3Ω, compared to the via hole of the connection structure of the first comparison example, and exhibited a value close to 50Ω. It can be inferred from these results that in practice, the conductive line L114 will further decrease in impedance than the values obtained in the simulation, and the via hole V1 will further increase in impedance than the values obtained in the simulation.

The fourth technical feature is easy impedance matching between the conductive line L114 of the wiring layer L11 and the via hole V1 for the reasons below. Generally speaking, when a multilayer printed wiring board is designed to transmit high frequency signals (high-speed signals) through a conductive line of a wiring layer and a via hole of the wiring board, or to transmit high frequency signals (high-speed signals) superimposed with power form the power supply through a conductive line of a wiring layer and a via hole of the wiring board, it is desirable to make the conductive line as wide as possible in order to minimize its resistive loss. However, too wide a conductive line may exhibit excessively low impedance. Generally in a multilayer printed wiring board, conductor layers, such as ground layers and wiring layers, are thin in thickness, i.e. are arranged at a small distance therebetween. Also, if a second impedance adjustment portion is too close to a wiring layer, the conductive line of the wiring layer may exhibit excessively low impedance. In view of the above, the wiring plate P may be designed such that the at least one first impedance adjustment layer L12 is disposed between the wiring layer L11 and the second impedance adjustment layer L13, in which the existence of the at least one first impedance adjustment layer L12 serves to keep a certain distance from the second impedance adjustment layer L13 to the wiring layer L11. As a result, the conductive line L114 of the wiring layer L11 can exhibit sufficiently low impedance while maximizing the width of the conductive line L114. In addition to the sufficiently low impedance of the conductive line L114, the via hole V1 is increased in impedance as described above, facilitating impedance matching between the conductive line L114 and the via hole V1. This in turn facilitate impedance matching between elements of the signal transmission path of the connection structure.

Fifth, the wiring plate P provides improved high frequency characteristics and electromagnetic compatibility (EMC) characteristics while preventing excessive impedance decrease of the via hole V1. This is because the via hole V1 is surrounded by the solid conductors of the ground layers L1, which are interconnected via the via holes V2. Generally, interconnecting the solid conductors of the ground layers results in impedance decrease of a via hole surrounded by the solid conductors of the ground layers. However, the wiring plate P is configured to establish the distance relationship R1<R2. By virtue of this distance relationship, interconnecting the solid conductors of the ground layers L1 via the via holes V2 will not result in excessive impedance decrease of the via hole V1.

The multilayer printed wiring board P and connector C are not limited to the embodiments described above and may be modified in any manner within the scope of the claims. Specific modifications will be described below.

The multilayer printed wiring board of the invention only requires a plurality of insulating layers, and a plurality of ground layers on the respective insulating layers, and at least one via hole. The ground layers of the invention are only required to each include at least one wiring layer and a first impedance adjustment layer of any aspect described above or to be described below. In other words, the second impedance adjustment layer and/or the connection layer of the ground layers may be omitted.

The openings of the ground layers (including but not limited to the wiring layer, the first impedance adjustment layer, the second impedance adjustment layer, and/or the connection layer) of the multilayer printed wiring board of the invention may be of any loop shape that can be disposed around a via hole of any aspect described above or to be described below. For example, the opening of the ground layer may be of polygonal loop shape. When used herein, the term "loop shape" means to a generally circular loop shape or a generally polygonal loop shape.

The passage of the wiring layer of the multilayer printed wiring board of the invention may be any passage in the solid conductor of the wiring layer such as to communicate with the opening of the wiring layer of any aspect described above. The conductive line of the wiring layer of the multilayer printed wiring board of the invention can be located anywhere inside the opening and the passage of the wiring layer of any aspect described above.

The via hole of the multilayer printed wiring board of the invention may be any hole provided in at least one of the ground layers and at least one of the insulating layers such as to be located inside the opening of the wiring layer and inside the opening of the first impedance adjustment layer and connected to the conductive line of the wiring layer of any aspect described above. There may be more than one via hole of any aspect described above. In this case, each of the via holes may preferably be provided in at least one of the ground layers and at least one of the insulating layers such as to be located inside the opening of the wiring layer and inside the opening of the first impedance adjustment layer and connected to the conductive line of the wiring layer of any aspect described above. Accordingly, the wiring layer should have a plurality of openings, and the first impedance adjustment layer should have a plurality of openings. The via hole of the multilayer printed wiring board of the invention may have a hole and a connection conductor of any aspect described above. In other words, it is possible to omit the first land, the second land, the third land, and/or the fourth land of the via hole. The via hole of the multilayer printed wiring board of the invention may be a buried via hole in at least one of the plurality of ground layers and at least one of the insulating layers of any aspect described above. The via hole V2 and/or V3 can be omitted.

The multilayer printed wiring board of the invention is configured such as to satisfy the distance relationship "the first distance<the second distance". The first distance is the distance in the first direction from the outline of the opening of the wiring layer of any aspect described above to the via hole of any aspect described above. The second distance is the distance in the first direction from the outline of the opening of the first impedance adjustment layer of any aspect described above to the via hole of any aspect described above. The first direction is any planar direction of the multilayer printed wiring board (any direction parallel to the plane of the multilayer printed wiring board).

Figure 10:
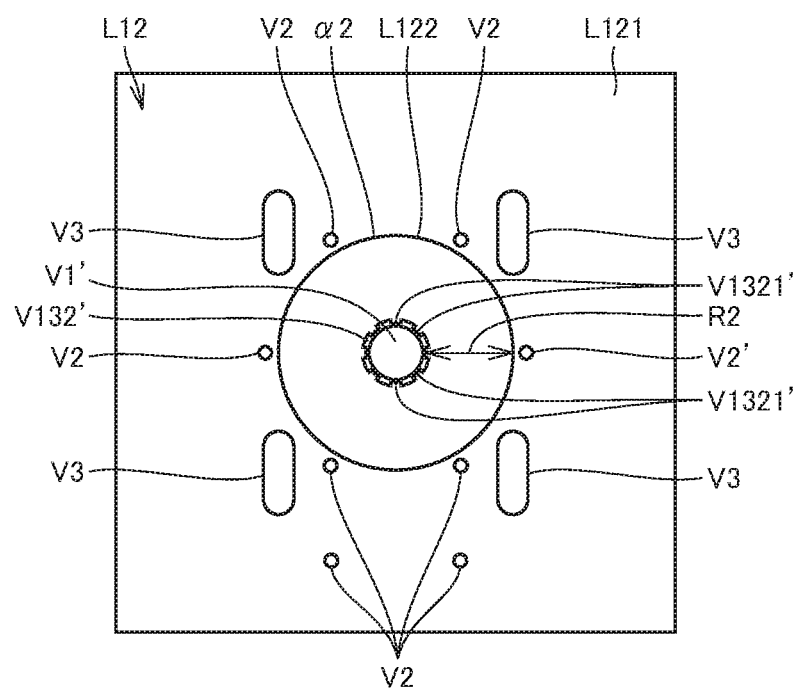
FIG. 10 illustrates a variant of the first impedance adjustment layer of the multilayer printed wiring board.

If the second land includes at least one recess recessed toward the central axis of the via hole of any aspect described above, the first distance may be the distance in the first direction from the outline of the opening of the wiring layer to the first land of the via hole, and the second distance may be the distance in the first direction from the outline of the opening of the first impedance adjustment layer and the bottom of the recess of the second land of the via hole. In this case, the second land may have the same outside dimension as that of the first land, may be smaller in outside dimension than the first land, or may be larger in outside dimension than the first land. The outline of the opening of the wiring layer may overlap the outline of the opening of the first impedance adjustment layer, or may be located closer to the central axis of the via hole than the outline of the opening of the first impedance adjustment layer, or may be located father apart from the central axis of the via hole than the outline of the opening of the first impedance adjustment layer. FIG. 10 illustrates a variant via hole V1' having a second land V132' with a plurality of recesses V1321'. The recesses V1321', spaced apart along the circumference of the second land V132', extend in antiradially. The second distance R2' is the distance in the first direction from the outline α2 of the opening L122 of the first impedance adjustment layer L12 to the bottoms of the recesses V1321' of the second land V132' of the via hole V1'. Except these modifications, the via hole V1' may be configured in the same manner as the via hole V1 of any aspect described above. The multilayer printed wiring board of the invention may further satisfy the distance relationship "the third distance<the second distance," where the third distance may be the distance in the first direction from the outline of the opening of the connection layer of any aspect described above to the via hole of any aspect described above.

The connector of the invention may be any connector including a terminal with its tail received in and connected to the via hole of the multilayer printed wiring board of any aspect described above. In embodiments where the multilayer printed wiring board includes a plurality of via holes, the connector of the invention may include a plurality of terminals held in its body. The via hole or holes of the multilayer printed wiring board of any aspect described above may be configured to receive and connect with a corresponding number of legs of an electronic component other than the connector.

It should be appreciated that the above embodiments and variants of the multilayer printed wiring board and the connection structure are described above by way of examples only. The materials, shapes, dimensions, numbers, arrangements, and other configurations of the constituents of the multilayer printed wiring board and the connection structure may be modified in any manner if they can perform similar functions. The configurations of the embodiments and the variants described above may be combined in any possible manner.

REFERENCE SIGNS LIST

P: Multilayer printed wiring board
  L1: Ground layer
    L11: Wiring layer
      L111: Solid conductor
      L112: Opening
        α1: Outline
      L113: Passage
      L114: Conductive line
    L12: First impedance adjustment layer
      L121: Solid conductor
      L122: Opening
        α2: Outline
    L12': First impedance adjustment layer
      L121': Solid conductor
      L122': Opening
        α2': Outline
      L123': Passage
    L13: Second impedance adjustment layer
      L131: Solid conductor
      L132: Opening
        α31: First outline
        α32: Second outline
      L133: Impedance adjustment portion
      L132': Opening
        α3': Outline
      L132": Opening
        α31": First outline
        α32": Second outline
        α33": Third outline
        α34": Fourth outline
    L14: Connection layer
      L141: Solid conductor
      L142: Opening
        α4: Outline
  L2: Insulating layer
  V1: Via hole (via hole defined in the claims)
    V11: Hole
    V12: Connection conductor
    V131: First land
    V132: Second land
    V133: Third land
    V134: Fourth land
  V2: Via hole
  V3: Via hole
R1: First distance
R2: Second distance
R3: Third distance
C: Connector
  10: Body
  20: Shell
  30: Case
  T: Terminal
    T1: Tail

The invention claimed is:
1. A multilayer printed wiring board, comprising:
a plurality of insulating layers;
a plurality of ground layers on the respective insulating layers, the ground layers including a wiring layer being an upper most layer of the multilayer printed wiring board, a plurality of first impedance adjustment layers, and a connection layer being a lower most layer of the multilayer printed wiring board; and
at least one via hole, wherein
the wiring layer includes:
  a solid conductor of the wiring layer, the solid conductor of the wiring layer having an opening and a passage, the passage communicating with the opening, and
  a conductive line inside the opening and the passage of the wiring layer,
each of the first impedance adjustment layers includes a solid conductor of the each first impedance adjustment layer, the solid conductor of the each first impedance adjustment layer having an opening,
the connection layer includes a solid conductor of the connection layer, the solid conductor of the connection layer having an opening,
the at least one via hole is provided in the insulating layers and the ground layers, the via hole being located inside the opening of the wiring layer, inside the opening of the each first impedance adjustment layer, and inside the opening of the connection layer and being connected to the conductive line,
wherein the via hole includes:
  a hole,
  a connection conductor of circular tuboid shape provided along a circumference of the hole,
  a first land inside the opening of the wiring layer, the first land being connected to the connection conductor,
  a plurality of second lands inside the respective openings of the first impedance adjustment layers, the second lands being connected to the connection conductor, and
a land inside the opening of the connection layer, the land inside the opening of the connection layer being connected to the connection conductor,
wherein a first distance is a distance in a first direction from an outer periphery of the opening of the wiring layer to the first land of the via hole, and
wherein a second distance is a distance, in the same direction as the direction of the first distance, from an outer periphery of the opening of the each first impedance adjustment layer to the second land of the via hole on the same first impedance adjustment layer, the second distance being the same for each of the first impedance adjustment layers,
wherein a third distance is a distance, in the same direction as the direction of the first distance, from the outer periphery of the opening of the connection layer to the land of the via hole that is inside the opening of the connection layer,
wherein the first distance is smaller than the second distance, and the third distance is smaller than the second distance,
wherein the first direction is a plane direction of the multilayer printed wiring board extending radially from the central axis of the via hole,
wherein the opening of the wiring layer, the openings of the first impedance adjustment layers, the opening of the connection layer, the first land, the second lands, and the land inside the opening of the connection layers are similar in shape to each other, and
wherein inside the opening of the wiring layer there exist no electrically conductive elements other than the first land and the conductive line, and wherein inside the opening of the connection layer there exist no electrically conductive elements other than the land inside the opening of the connection layer.

2. The multilayer printed wiring board according to claim 1, wherein, each of the second lands is smaller in outside dimension than the first land.

3. The multilayer printed wiring board according to claim 1, wherein
the outer periphery of the opening of the wiring layer is located closer to a central axis of the via hole than the outer periphery of the opening of the each first impedance adjustment layer is.

4. The multilayer printed wiring board according to claim 2, wherein
the outer periphery of the opening of the wiring layer is located closer to a central axis of the via hole than the outer periphery of the opening of the each first impedance adjustment layer is.

5. The multilayer printed wiring board according to claim 2, wherein the opening of the wiring layer entirely overlaps the opening of the each first impedance adjustment layer in a second direction orthogonal to the first direction.

6. The multilayer printed wiring board according to claim 1,
wherein the ground layers further include a second impedance adjustment layer,
wherein the second impedance adjustment layer includes a solid conductor of the second impedance adjustment layer, the solid conductor of the second impedance adjustment layer having an opening,
wherein the solid conductor of the second impedance adjustment layer includes an impedance adjustment portion, the impedance adjustment portion overlapping the conductive line of the wiring layer, and
wherein the at least one via hole is provided in the ground layers and the insulating layers such as to be located inside the respective openings of the wiring layer, the first impedance adjustment layers, the second impedance adjustment layer, and the connection layer.

7. The multilayer printed wiring board according to claim 6, wherein at least one of the first impedance adjustment layers is disposed between the wiring layer and the second impedance adjustment layer.

8. The multilayer printed wiring board according to claim 6, wherein
at least one of the first impedance adjustment layers is disposed between the wiring layer and the second impedance adjustment layer and/or between the second impedance adjustment layer and the connection layer.

9. The multilayer printed wiring board according to claim 1, wherein
the second land is smaller in size than the land inside the opening of the connection layer.

10. The multilayer printed wiring board according to claim 1, wherein the outer periphery of the opening of the connection layer is closer to a central axis of the via hole than the outer periphery of the opening of the each first impedance adjustment layer is.

11. The multilayer printed wiring board according to claim 9, wherein the opening of the connection layer entirely overlaps the opening of the each first impedance adjustment layer in a second direction orthogonal to the first direction.

12. The multilayer printed wiring board according to claim 1, wherein
the ground layers and the insulating layers are disposed alternately in a second direction orthogonal to the first direction,
the wiring layer is one of the ground layers, and each of the first impedance adjustment layers is one of the ground layers excluding the wiring layer.

13. The multilayer printed wiring board according to claim 6, wherein
the ground layers and the insulating layers are disposed alternately in a second direction orthogonal to the first direction,
the wiring layer is one of the ground layers,
each of the first impedance adjustment layers is one of the ground layers excluding the wiring layer, and
the second impedance adjustment layer is one of the ground layers excluding the wiring layer and the first impedance adjustment layers.

14. The multilayer printed wiring board according to claim 8, wherein
the ground layers and the insulating layers are disposed alternately in a second direction orthogonal to the first direction,
the wiring layer is one of the ground layers,
each of the first impedance adjustment layers is one of the ground layers excluding the wiring layer, and
the connection layer is one of the ground layers excluding the wiring layer and the first impedance adjustment layers.

15. A connection structure of a multilayer printed wiring board and a connector, the connection structure comprising:
the multilayer printed wiring board according to claim 1, the via hole of the multilayer printed wiring board being a through via hole or a blind via hole; and
a connector including a terminal, the terminal including a tail received in and connected to the via hole of the multilayer printed wiring board.

16. The multilayer printed wiring board according to claim 6, wherein the via hole further includes a third land inside the opening of the second impedance adjustment layer.

17. The multilayer printed wiring board according to claim 1, wherein only the plurality of first impedance adjustment layers exist between the wiring layer and the connection layer along the plurality of insulating layers.

18. The multilayer printed wiring board according to claim 16, wherein only the plurality of first impedance adjustment layers and the second impedance adjustment layer exist between the wiring layer and the connection layer along the plurality of insulating layers.

* * * * *